US011319252B2

(12) United States Patent
Nakajima

(10) Patent No.: US 11,319,252 B2
(45) Date of Patent: May 3, 2022

(54) CERAMIC COMPOSITION AND ELECTRONIC COMPONENT INCLUDING THE SAME

(71) Applicant: TAIYO YUDEN CO., LTD., Tokyo (JP)

(72) Inventor: Takashi Nakajima, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/829,864

(22) Filed: Mar. 25, 2020

(65) Prior Publication Data

US 2020/0308058 A1    Oct. 1, 2020

(30) Foreign Application Priority Data

Mar. 28, 2019    (JP) .............................. JP2019-063380

(51) Int. Cl.
*C04B 35/22* (2006.01)
*H01G 4/12* (2006.01)
*H05K 1/03* (2006.01)
*H01L 23/15* (2006.01)

(52) U.S. Cl.
CPC ........... *C04B 35/22* (2013.01); *H01G 4/1209* (2013.01); *H01L 23/15* (2013.01); *H05K 1/0306* (2013.01); *C04B 2235/3206* (2013.01); *C04B 2235/3208* (2013.01); *C04B 2235/3298* (2013.01); *C04B 2235/3445* (2013.01)

(58) Field of Classification Search
CPC ............ C04B 35/22; C04B 2235/3206; C04B 2235/3208; C04B 2235/3298; C04B 2235/3445; H01G 4/1209; H01L 23/15; H05K 1/0306
See application file for complete search history.

(56) References Cited

U.S. PATENT DOCUMENTS

2006/0040819 A1    2/2006 Kataoka et al.
2006/0172878 A1    8/2006 Kidani et al.

FOREIGN PATENT DOCUMENTS

| JP | 2001-278657 A | 10/2001 |
| JP | 2003-286074 A | 10/2003 |
| JP | 2005-289701 A | 10/2005 |
| JP | 2006-273676 A | 10/2006 |
| JP | 2006-523602 A | 10/2006 |

(Continued)

*Primary Examiner* — Karl E Group
*Assistant Examiner* — Cameron K Miller
(74) *Attorney, Agent, or Firm* — Pillsbury Winthrop Shaw Pittman, LLP

(57) ABSTRACT

A ceramic composition according to an embodiment of the present invention contains: a main phase component represented by $CaMgSi_2O_6$ or $Ba_4(Re_{(1-x)}, Bi_x)_{9.33}Ti_{18}O_{54}$; and an additive component containing a Li component and a B component, An observation field, a part of a sectional surface of the ceramic composition, is divided into a plurality of unit observation regions. Among all the unit observation regions, those containing no or little sintering agent component are referred to as the main crystal regions. An area percentage of main crystal regions relative to the observation field is 30% or more, the main crystal regions being the unit observation regions containing 0.5% or less by area of the additive component.

7 Claims, 2 Drawing Sheets

(56) References Cited

FOREIGN PATENT DOCUMENTS

| | | | |
|---|---|---|---|
| JP | 2010-037126 A | | 2/2010 |
| JP | 2010037126 | * | 2/2010 |
| JP | 2006273676 | * | 1/2011 |
| JP | 2012-148919 A | | 8/2012 |
| JP | 2012-188339 A | | 10/2012 |
| WO | 2004/076380 A1 | | 9/2004 |

* cited by examiner

CERAMIC COMPOSITION AND ELECTRONIC COMPONENT INCLUDING THE SAME

CROSS-REFERENCE TO RELATED APPLICATIONS

This application is based on and claims the benefit of priority from Japanese Patent Application Serial No. 2019-063380 (filed on Mar. 28, 2019), the contents of which are hereby incorporated by reference in their entirety.

TECHNICAL FIELD

The present disclosure relates to a ceramic composition and an electronic component including the ceramic composition.

BACKGROUND

With the increasing speed of information communications, it has been demanded that high-frequency signals be transmitted without loss. To this end, a low-resistance metal material such as copper or silver is used as a material for an internal conductor of an electronic component of an information communication device. In a manufacturing process of the electronic component, the internal conductor is formed by co-firing a conductive paste applied to a substrate material with the substrate material. When firing is performed at a high temperature, a low-resistance metal might be diffused into the substrate material, and it is therefore demanded that the substrate material be sinterable at a low temperature.

Known examples of ceramic materials that can be sintered at a low temperature include ceramic compositions containing a diopside represented by $CaMgSi_2O_6$ as a main component and ceramic compositions containing a tungsten bronze pseudo-solid solution represented by $Ba_4(Re_{(1-x)},Bi_x)_{9.33}Ti_{18}O_{54}$ as a main phase component. Ceramic compositions containing a diopside crystal as a main crystal are disclosed in Japanese Patent Application Publication Nos. 2001-278657, 2003-286074, 2005-289701, 2006-273676, 2006-523602, 2010-037126, and 2012-188339 and International Publication No. WO2004/076380. A ceramic composition containing a tungsten bronze pseudo-solid solution as a main component is disclosed in Japanese Patent Application Publication No. 2012-148919. As disclosed in these publications, conventional ceramic compositions made of a diopside or a tungsten bronze pseudo-solid solution as the main phase component contain Li and B oxides. Li and B components act as sintering agents when a ceramic material is sintered to obtain a sintered compact of the ceramic composition. Ceramic materials containing Li and B components can be sintered at a low temperature.

The substrate material of electronic components used in high-frequency circuits should preferably have a low dielectric loss. There is a demand that the dielectric loss be further reduced in the ceramic compositions containing a diopside or a tungsten bronze pseudo-solid solution as a main phase component and containing Li and B oxides as sintering agents.

SUMMARY

One object of the present disclosure is to provide a ceramic composition that is sinterable at a low temperature and has a reduced dielectric loss in a high-frequency region, and an electronic component including such a ceramic composition.

The inventors of the present invention have found that a sintering agent, such as $Li_2O$ and $B_2O_3$, used for sintering a ceramic material containing crystal of a diopside or a tungsten bronze pseudo-solid solution as a main crystal acts to inhibit growth of the main crystal during sintering. In particular, it was found that the high viscosity of the liquid phase of the sintering agent significantly inhibited the growth of the main crystal during sintering.

The sintering agent is deposited around the main phase crystal or on the grain boundary within the main phase crystal that has grown large. As a result of the research by the inventors, it was found that a low viscosity of the liquid phase of the sintering agent facilitates flow of the sintering agent into the periphery or the grain boundary of the main phase crystal during the sintering, and therefore, the deposit of the sintering agent is distributed significantly unevenly in the sintered compact of the ceramic composition after the sintering. Therefore, in the ceramic composition according to an embodiment of the present invention, the dielectric loss is reduced in view of the area percentage of the main crystal regions that contain no or little sintering agent component relative to the observation field. Specifically, the ceramic composition according to an embodiment of the present invention includes: a main phase component represented by $CaMgSi_2O_6$ or $Ba_4(Re_{(1-x)},Bi_x)_{9.33}Ti_{18}O_{54}$; and an additive component containing a Li component and a B component, wherein an area percentage of main crystal regions relative to an observation field is 30% or more, the observation field being divided into a plurality of unit observation regions, the main crystal regions being the unit observation regions containing 0.5% or less by area of the additive component. In such a ceramic composition, the crystal of the main phase can grow sufficiently, and as a result, the Q value of the ceramic composition can be improved.

The inventor of the present invention found that since the deposit of the sintering agent has a lower strength than the crystal of the main phase component, excessive unevenness in distribution of the deposit of the sintering agent causes degradation of the flexural strength of the sintered ceramic composition. To address this drawback, an embodiment of the present invention is configured such that the area percentage of the main crystal regions is 90% or less. In such a ceramic composition, degradation of the flexural strength can be suppressed.

In an embodiment of the present invention, the content of the Li component in terms of an oxide thereof is larger than the content of the B component in terms of an oxide thereof. As the Li content is larger, the viscosity of the liquid phase of the sintering agent is lower. Therefore, the ceramic composition has a larger content of the Li component than that of the B component to improve the Q value.

The inventor also found that the segregated sintering agent can reduce the insulation quality of the ceramic composition, particularly in high-temperature environments. The inventors of the present invention also found that, when a content of $Li_2O$ is smaller than a content of $B_2O_3$ in the sintering agent, diopside is dissolved insufficiently in the sintering agent present as a liquid phase during sintering, resulting in an insufficient density of the sintered compact of the ceramic composition.

Based on the above-described findings, a ceramic composition according to an embodiment contains 0.3 to 1.5 parts by mass of the Li component in terms of an oxide thereof and 0.1 to 1 part by mass of the B component in terms of an oxide thereof, relative to 100 parts by mass of the diopside crystal powder. In the above-described embodiment, the content of the Li component in terms of the oxide thereof is larger than the content of the B component in terms of the oxide thereof. Since the minimum contents of the Li component and the B component are 0.3 parts by mass and 0.1 parts by mass, respectively, and the content of the Li component is larger than the content of the B component, the total content of the Li component and the B component is larger than 0.4 parts by mass in terms of oxides thereof. In the above-described embodiment, the total content of the Li component and the B component is 2.25 parts by mass or less in terms of oxides thereof.

The ceramic composition according to an embodiment further contains 3.6 to 19 parts by mass of $SrTiO_3$ powder relative to 100 parts by mass of the diopside crystal powder.

The ceramic composition according to an embodiment further contains 0 to 3 parts by mass of an Ag component in terms of an oxide thereof relative to 100 parts by mass of the diopside crystal powder.

The ceramic composition according to an embodiment further contains 0 to 1 part by mass of Si component in terms of an oxide thereof relative to 100 parts by mass of the diopside crystal powder.

An electronic component according to an embodiment includes a ceramic layer obtained by firing the above-described ceramic composition and a conductor layer provided on a surface of and/or in an interior of the ceramic layer and obtained through co-firing with the ceramic composition.

ADVANTAGES

According to the embodiments of the present invention, provided are a ceramic composition that is sinterable at a low temperature and has reduced dielectric loss in a high-frequency region, and an electronic component including the ceramic composition.

DESCRIPTION OF THE EMBODIMENTS

Figure 1:
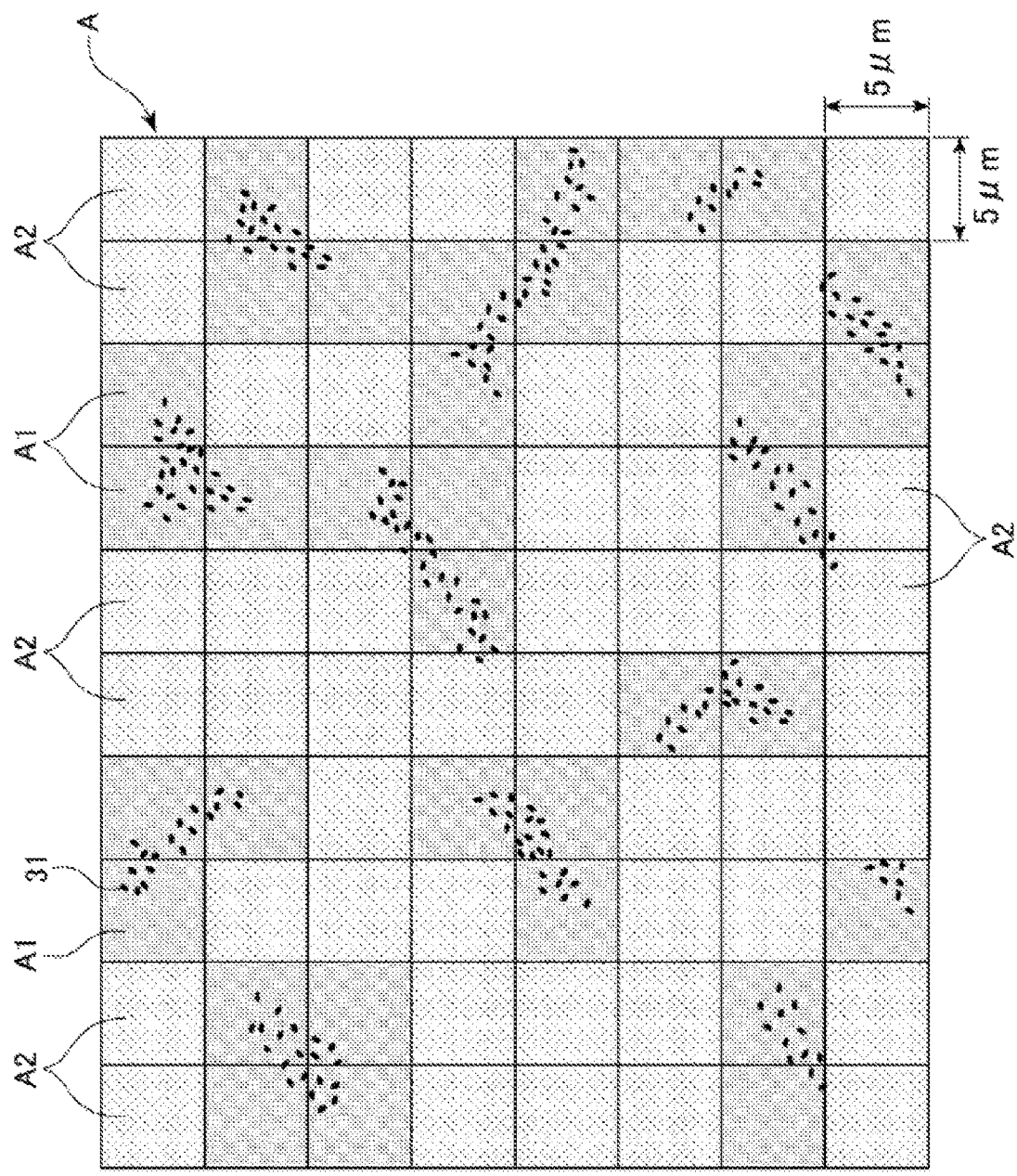
FIG. 1 schematically shows a distribution of Li and B components in an observation field A set in a sectional surface of the ceramic composition according to an embodiment of the present invention.

A ceramic composition according to an embodiment of the present invention will be hereinafter described. The ceramic composition according to an embodiment of the present invention contains, as a main component, diopside crystal powder or tungsten bronze pseudo-solid solution crystal powder.

The diopside crystal powder is prepared by mixing ceramic powder made of a non-glass material such as oxides and carbonates of Si, Mg, and Ca to form a mixture having a stoichiometric ratio of diopside (Ca:Mg:Si=1:1:2), heating the mixture at a temperature equal to or lower than a melting point, sintering the mixture by the solid-phase reaction method, and pulverizing the sintered mixture to a predetermined grain size. The diopside crystal powder obtained by sintering the ceramic powder as described above is preferably adjusted to contain Si, Mg, and Ca at the following proportions in terms of oxides thereof: 53.5 to 62 mass % $SiO_2$, 12 to 22 mass % MgO, and 21 to 32 mass % CaO, or more preferably, 56 to 59.5 mass % $SiO_2$, 15 to 19 mass % MgO, and 23.5 to 29.5 mass % CaO. Adjusting the contents of $SiO_2$, MgO, and CaO into the above-described ranges facilitates deposition of a diopside crystal.

When the content of $SiO_2$ is more than 62 mass %, a wollastonite tends to form, resulting in increased dielectric loss and reduced strength. Furthermore, when the content of $SiO_2$ is less than 53.5 mass %, an akermanite crystal tends to form, resulting in increased dielectric loss.

When the content of MgO is more than 22 mass %, a forsterite crystal tends to form, resulting in reduced strength. Furthermore, when the content of MgO is less than 12 mass %, a wollastonite crystal tends to form, resulting in increased dielectric loss.

When the content of CaO is more than 32 mass %, a wollastonite crystal and an akermanite crystal tend to form, resulting in increased dielectric loss and reduced strength. Furthermore, when the content of CaO is less than 21 mass %, a forsterite crystal tends to form, resulting in reduced strength.

In one embodiment, an average grain size of the diopside crystal powder is in a range of 0.1 to 2 μm. When the average grain size of the diopside crystal powder is less than 0.1 μm, a specific surface area (BET value) of the diopside crystal powder is increased, so that a green sheet formed from a ceramic material containing the diopside crystal powder tends to have a small density. A ceramic layer formed by firing the green sheet might contract significantly due to its low density. As a result, a conductor layer formed on the ceramic layer through co-firing tends to peel off from the ceramic layer. When the average grain size of the diopside crystal powder is more than 2 μm, it is difficult to form a thin green sheet from the ceramic material containing the diopside crystal powder. The average grain size of the diopside crystal powder may refer to a value obtained by grain size distribution measurement based on a laser diffraction/scattering method.

The ceramic composition according to one embodiment of the present invention may contain $SrTiO_3$ powder. A temperature coefficient τf of resonance frequency of the diopside crystal alone exhibits a negative characteristic (approximately $-65 \times 10^{-6}/°$ C.). On the other hand, the temperature coefficient τf of the resonance frequency of a $SrTiO_3$ crystal is $1670 \times 10^{-6}/°$ C., and thus the temperature coefficient τf of the resonance frequency of the $SrTiO_3$ crystal alone exhibits a positive characteristic. Accordingly, by adding the $SrTiO_3$ powder to the ceramic composition, the temperature coefficient τf of the resonance frequency can be adjusted to approximate to zero.

In a crystalline phase formed after sintering the $SrTiO_3$ powder with the diopside crystal, a (xCa,1-xSr)$TiO_3$ perovskite compound is formed in which $SrTiO_3$ is present alone or calcium is dissolved into $SrTiO_3$ to form a solid solution. The temperature coefficient τf of the resonance frequency of the perovskite compound exhibits a positive value, and thus a small amount of $SrTiO_3$ powder can be added such that the temperature coefficient τf of the resonance frequency of the ceramic composition (sintered compact) containing the diopside crystal can be increased to approximate to zero.

For a resonance frequency of a composition formed by combining different types of materials, Formula (1) below is empirically known to hold.

{Temperature Coefficient τf of Resonance Frequency of Composite Material=Σ(Volume Fractions (vol %) of Components×Temperature Coefficients τf of Resonance Frequency of Components))}   Formula (1)

Furthermore, for a permittivity of the composition formed by combining different types of materials, Formula (2) below is empirically known to hold.

{log(Permittivity ε of Composite Material)=Σ(Volume Fractions (vol %) of Components×log(Permittivities ε of Components)}   Formula (2)

Further, the temperature coefficient τf of resonance frequency and permittivity ε of $SrTiO_3$ are as follows: $\tau f=1670\times10^{-6}$, and $\varepsilon=255$. Thus, by adding the $SrTiO_3$ powder to the ceramic material containing the diopside crystal as a main component and firing the ceramic material to obtain the ceramic composition, the permittivity and temperature coefficient of resonance frequency of the ceramic composition can be adjusted.

The ceramic composition according to one embodiment of the present invention contains 4 to 19 parts by mass of the $SrTiO_3$ powder relative to 100 parts by mass of the diopside crystal powder. When the content of the $SiTiO_3$ powder is within the above range, the temperature coefficient τf of resonance frequency can be adjusted to approximate to zero, while reducing the dielectric loss in a high-frequency region.

The ceramic composition according to one embodiment of the present invention contains 6 to 10 parts by mass of the $SrTiO_3$ powder relative to 100 parts by mass of the diopside crystal powder. When the content of the $SiTiO_3$ powder is within the above range, the temperature coefficient τf of resonance frequency can be adjusted to a value approximate to zero.

In one embodiment, the $SrTiO_3$ powder has an average grain size of 0.1 to 2 μm for appropriately controlling sinterability, strength, and the temperature coefficient τf of resonance frequency of the ceramic composition (sintered compact) obtained by sintering. In one embodiment, the $SrTiO_3$ powder has an average grain size of 0.8 to 1.5 μm in order to improve dispersibility of the $SrTiO_3$ powder in the diopside crystal powder. The average grain size of the $SrTiO_3$ powder may refer to a value obtained by grain size distribution measurement based on a laser diffraction/scattering method.

The ceramic composition according to one embodiment contains a Li component. Examples of the Li component include a Li oxide ($Li_2O$). The ceramic composition containing the Li component is obtained by, for example, firing a ceramic material having the Li oxide added thereto. Since the Li component (for example, the Li oxide) is contained in the ceramic material, a liquid phase is formed during sintering, so that a sintering temperature of the ceramic material can be reduced. In other words, the Li component acts as a sintering agent. In the ceramic composition (sintered compact) according to one embodiment, the Li component is contained in an amount of 0.3 to 1.5 parts by mass in terms of an oxide thereof ($Li_2O$) relative to 100 parts by mass of the diopside crystal powder. When the content of the Li component in the ceramic composition is less than 0.3 parts by mass in terms of the oxide thereof, reduced sinterability of the ceramic composition prevents sintering at a low temperature (for example, 900° C. or lower). Furthermore, when the content of Li in the ceramic composition is more than 1.5 parts by mass, a larger amount of $Li_2O$ is segregated on a periphery or a grain boundary of diopside crystal grains, resulting in a reduced insulation property under a high-temperature environment.

The ceramic composition in one embodiment contains a B component. Examples of the B component include a B oxide ($B_2O_3$). The ceramic composition containing the B component is obtained by, for example, firing a ceramic material having the B oxide added thereto. Since the B component (for example, the B oxide) is contained in the ceramic material, a liquid phase is formed during sintering, so that a sintering temperature of the ceramic material can be reduced. In other words, the B component acts as a sintering agent. In the ceramic composition (sintered compact) according to one embodiment, the B component is contained in an amount of 0.1 to 1 part by mass in terms of the oxide thereof ($B_2O_3$) relative to 100 parts by mass of the diopside crystal powder. When the content of the B component in the ceramic composition is less than 0.1 parts by mass in terms of the oxide thereof, reduced sinterability of the ceramic composition prevents sintering at a low temperature (for example, 900° C. or lower). Furthermore, when the content of B in the ceramic composition is more than 1 part by mass, a larger amount of $B_2O_3$ is segregated on the periphery or the grain boundary of the diopside crystal grains, resulting in a reduced insulation property under the high-temperature environment.

In the ceramic composition according to one embodiment, the Li component and the B component described above are essential components. The ceramic composition according to one embodiment contains the Li component and the B component so that the content of the Li component in terms of the oxide thereof is larger than the content of the B component in terms of the oxide thereof. Since the content of the Li component is larger than the content of the B component in the ceramic composition, dissolution of the diopside in Li that is present as a liquid phase is facilitated in the course of densification, so that a dense sintered compact of the ceramic composition is obtained. Furthermore, a total content of the Li component and the B component is 2.25 parts by mass or less in terms of oxides thereof. The reason for this is that when the total content of the Li component and the B component is 2.25 parts by mass or more, larger volumes of $Li_2O$ and $B_2O_3$ are segregated on the periphery or the grain boundary of the diopside crystal grains, resulting in a reduced insulation property under the high-temperature environment.

Since the B component is a glass network former and the Li component is a glass network modifier, the ratio of the Li component to the B component may be increased to lower the viscosity of the liquid phase of the sintering agent during sintering. A high viscosity of the sintering agent inhibits the growth of the crystal of the main component during sintering. With a low viscosity, the sintering agent is less prone to inhibit the growth of crystal of the main component. When the viscosity of the sintering agent is low, the crystal of the main component (main crystal) can grow large, and as a result, the quality factor (Q value) of the sintered ceramic composition can be increased.

The sintering agent is segregated on the periphery or the grain boundary of the crystal of the main component in the sintered ceramic composition. When the viscosity of the sintering agent is low, the crystal of the main component (main crystal) can grow large, and therefore, the sintering agent is deposited (segregated) unevenly on a region in the sintered ceramic composition. Therefore, when the unevenness of the segregated sintering agent is large, the main crystal has grown large, and as a result, the quality factor (Q value) of the ceramic composition is higher.

The unevenness of the segregated sintering agent in the ceramic composition is represented by the area percentage of main crystal regions relative to an observation field. The observation field is a part of a sectional surface of the ceramic composition and is divided into a plurality of unit observation regions. Among all the unit observation regions, those containing no or little sintering agent component are referred to as the main crystal regions. Since the deposition region of the sintering agent is smaller as the area percentage of the main crystal regions is larger, a large area percentage of the main crystal regions means a large unevenness of the sintering agent in the ceramic composition.

One example of calculation of the area percentage of the main crystal regions is as follows. First, the observation field is determined for calculation of the area percentage of the main crystal regions. The observation field may be a part of a sectional surface of the ceramic composition and may have an area of, for example, 50 μm×40 μm. This observation field of 50 μm by 40 μm is divided laterally into ten equal parts and longitudinally into eight equal parts to define unit observation regions each having an area of 5 μm square. For each of the 40 unit observation regions, the percentage of the area occupied by the sintering agent component (an additive component containing the Li component and the B component) is determined relative to the area of the unit observation region. The area occupied by the sintering agent component within the area of a unit observation region can be determined by obtaining a distribution image of B element under the electron probe micro-analyzer (EPMA) and observing the difference in brightness between regions containing B element and the other regions in the distribution image. When the total area occupied by the B component relative to the entire area of a unit observation region is from 0% to 0.5%, it is determined that this unit observation region is a main crystal region that contains no or little sintering agent component (the B component). Since it is difficult to identify Li element with EPMA, the presence of the sintering agent component in the unit observation region is determined based on the area occupied by B element. In this way, each unit observation region in the observation field is examined to determine whether it is a main crystal region, and the area percentage of the main crystal regions is found at the proportion of the unit observation regions that are determined to be the main crystal regions among all the unit observation regions in the observation field. For example, when 20 of the 80 unit observation regions in the observation field are determined to be the main crystal regions, the area percentage of the main crystal regions is 25% (100× 20/80).

Reference is now made to FIG. 1 to describe the distribution of deposit of the sintering agent (the Li component and the B component) in the sectional surface of the ceramic composition according to an embodiment of the present invention. FIG. 1 schematically shows a distribution of Li element and B element in an observation field A set in a sectional surface of the ceramic composition according to an embodiment of the present invention. FIG. 1 schematically shows a distribution image of Li element and B element within the observation field A of 50 μm by 40 μm in the sectional surface of the ceramic composition according to an embodiment. The distribution image is obtained under the electron probe micro analyzer (EPMA). This distribution image has been subjected to image processing to distinguish the sintering agent deposit 31 containing Li element and B element from other regions. The Li element may not be distinguished when an actual ceramic composition is observed with the EPMA. As shown, the observation field A is divided laterally into ten equal parts and longitudinally into eight equal parts to define unit observation regions each having an area of 5 μm square. For each of the unit observation regions, the area occupied by the sintering agent deposit 31 is determined. When the total area of the sintering agent deposit 31 in a unit observation region is more than 0.5% of the area of the unit observation region, the unit observation region is determined to be a sintering agent region A1, and when the total area of the sintering agent deposit 31 in a unit observation region is from 0% to 0.5% of the area of the unit observation region, the unit observation region is determined to be a main crystal region A2. In the example shown, 34 of the 80 unit observation regions in the observation field A are sintered agent regions A1, and the remaining 46 unit observation regions are main crystal regions A2. More specifically, of the ten unit observation regions in row 1, those in columns 3, 4, 7, and 8 are the sintering agent regions A1. Of the ten unit observation regions in row 2, those in columns 1, 2, 4, 7, 9, and 10 are the sintering agent regions A1. Of the ten unit observation regions in row 3, those in columns 1, 2, 7, and 9 are the sintering agent regions A1. Of the ten unit observation regions in row 4, those in columns 4 and 6 to 9 are the sintering agent regions A1. Of the ten unit observation regions in row 5, those in columns 3 to 4 and 9 to 10 are the sintering agent regions A1. Of the ten unit observation regions in row 6, those in columns 5 and 10 are the sintering agent regions A1. Of the ten unit observation regions in row 7, those in columns 1 to 2, 5, 7 to 8, and 10 are the sintering agent regions A1. Of the ten unit observation regions in row 8, those in columns 3 and 8 to 9 are the sintering agent regions A1. As in columns 6 and 7 in row 8, when the area percentage of the sintering agent deposit 31 is as small as 0.5% or less, such a unit observation region is sorted as a main crystal region A2. In FIG. 1, only a part of the unit observation regions in rows 1 and 8 are denoted as the sintering agent regions A1 and the main crystal regions A2, and the reference signs are omitted for the other unit observation regions to simplify the drawing.

In the example shown, 46 of the 80 unit observation regions in the observation field A are main crystal regions A2, and therefore, the area percentage of the main crystal regions A2 relative to the observation field A is 57.5%. In an embodiment of the present invention, the area percentage of the main crystal regions thus determined is from 30% to 90%.

In a ceramic composition, a large area percentage of the main crystal regions means that the main crystal has grown large and thus the unevenness of the sintering agent component is large. In an embodiment of the present invention, the area percentage of the main crystal regions in the ceramic composition is 30% or more. When the area percentage of the main crystal regions is 30% or more, the main crystal has grown sufficiently, resulting in a high quality factor.

In an embodiment of the present invention, the area percentage of the main crystal regions is 90% or less. In a ceramic composition, a large area percentage of the main crystal regions means that the unevenness of the sintering agent component is large. Due to the low strength of the segregate of the sintering agent component, an excessive unevenness of the sintering agent component in the ceramic composition leads to insufficient strength of the regions where the sintering agent component is segregated. When the area percentage of the main crystal regions is 90% or less, a necessary strength can be ensured.

The area percentage of the main crystal regions in the ceramic composition may be either calculated with one observation field in a SEM photograph of a sectional surface of the ceramic composition or calculated by averaging the area percentages of the main crystal regions calculated with a plurality of observation fields.

The ceramic composition according to an embodiment may contain an Al component. Examples of the Al component include an Al oxide, an Al carbonate, and a compound containing any other Al component. The ceramic composition containing the Al component is obtained by, for example, firing a ceramic material having the Al component added thereto. The Al component contained in the ceramic material provides a solid structure and an improved chemical durability of the grain boundary of the sintered ceramic composition. Therefore, the ceramic composition obtains a high plating resistance. The ceramic composition according to an embodiment may contain 0.05 to 3.5 parts by mass of the Al component in terms of an oxide thereof ($Al_2O_3$) relative to 100 parts by mass of the diopside crystal powder. When the content of the Al component in the ceramic composition is less than 0.05 parts by mass in terms of the oxide thereof, the effect of adding the Al component is so poor that the sintered compact of the ceramic composition cannot have a high plating resistance. Furthermore, when the content of the Al component is more than 6 parts by mass, reduced sinterability of the ceramic composition prevents sintering at a low temperature (for example, 900° C. or lower).

The ceramic composition according to an embodiment may contain a Zn component. Examples of the Zn component include a Zn oxide, a Zn carbonate, and a compound containing any other Zn component. The ceramic composition containing the Zn component is obtained by, for example, firing a ceramic material having the Zn component added thereto. Since the Zn component is contained, a liquid phase is formed during sintering, so that a sintering temperature of the ceramic material can be lowered. Furthermore, the Zn component contained in the ceramic composition improves the water resistance of the ceramic composition. The ceramic composition according to an embodiment may contain 0.05 to 5.1 parts by mass of the Zn component in terms of an oxide thereof (ZnO) relative to 100 parts by mass of the diopside crystal powder. When the content of the Zn component in the ceramic composition is less than 3.2 parts by mass in terms of the oxide thereof, reduced sinterability of the ceramic composition prevents sintering at a low temperature (for example, 900° C. or lower). When the content of the Zn component in the ceramic composition is more than 5.1 parts by mass, the Q f value decreases, resulting in an increased dielectric loss.

The ceramic composition according to an embodiment may contain a Cu component and an Ag component. Examples of the Cu component include a Cu oxide, a Cu carbonate, and a compound containing any other Cu component. Examples of the Ag component include an Ag oxide, an Ag carbonate, and a compound containing any other Ag component. The ceramic composition containing the Cu component is obtained by, for example, firing a ceramic material having the Cu component added thereto. The ceramic composition containing the Ag component is obtained by, for example, firing a ceramic material having the Ag component added thereto. Since the Cu component is contained in the ceramic material, when Cu or a Cu alloy used as a material of a conductor metal is co-fired with the ceramic material, it is possible to suppress dissolution of the conductor metal into a liquid phase of the ceramic material. Since the Ag component is contained in the ceramic composition, when Ag or an Ag alloy used as a material of a conductor metal is co-fired with the ceramic material, it is possible to suppress dissolution of the conductor metal into a liquid phase of the ceramic material. By suppressing dissolution of the conductor metal into the ceramic material as described above, it is possible to suppress disappearance of a conductor at the time of sintering an electronic component formed of the ceramic composition. The ceramic composition according to an embodiment may contain the Cu component and the Ag component in a total amount of 0 to 3 parts by mass, or preferably 0.05 to 1.0 part by mass in terms of oxides thereof (CuO, $Ag_2O$) relative to 100 parts by mass of the diopside crystal powder. In a case where the total content of the Cu component and the Ag component in the ceramic composition is less than 0.05 parts by mass in terms of the oxides thereof, when the ceramic material for obtaining this ceramic composition is co-fired with a conductor metal, it may not be possible to prevent dissolution of the conductor metal into a liquid phase of the ceramic material. When the content of the Cu component in the ceramic composition is more than 0.7 parts by mass, fusion occurs during sintering, and thus the ceramic composition (sintered compact) tends to be degraded in shape stability and insulation property. For this reason, the content of the Cu component in the ceramic composition may be less than 0.7 parts by mass. When the content of the Ag component in the ceramic composition is more than 3 parts by mass, its plating resistance tends to be low. For this reason, the content of the Ag component in the ceramic composition may be less than 3 parts by mass.

The ceramic composition according to an embodiment may contain a Co component. Examples of the Co component include a Co oxide, a Co carbonate, and a compound containing any other Co component. The ceramic composition containing the Co component is obtained by, for example, firing a ceramic material having the Co component added thereto. Since the Co component is contained in the ceramic composition, the sinterability of the ceramic composition can be improved. The ceramic composition according to an embodiment may contain 0 to 4.5 parts by mass, or preferably 0.05 to 4.5 parts by mass of the Co component in terms of an oxide thereof (CoO) relative to 100 parts by mass of the diopside crystal powder. When the content of the Co component is less than 0.05 parts by mass in terms of the oxide thereof, there is almost no effect of adding the Co component, and when the content of the Co component is more than 4.5 parts by mass, fusion tends to occur during sintering.

The ceramic composition according to an embodiment may contain a Zr component. Examples of the Zr component include a Zr oxide, a Zr carbonate, and a compound containing any other Zr component. The ceramic composition containing the Zr component is obtained by, for example, firing a ceramic material having the Zr component added thereto. Since the Zr component is contained in the ceramic composition, the plating resistance of the ceramic composition can be improved. The ceramic composition according to an embodiment may contain 0.01 to 2 parts by mass of the Zr component in terms of the oxide thereof ($ZrO_2$) relative to 100 parts by mass of the diopside crystal powder.

The ceramic composition according to an embodiment may contain a Bi component. Examples of the Bi component include a Bi oxide, a Bi carbonate, and a compound containing any other Bi component. The ceramic composition containing the Bi component is obtained by, for example, firing a ceramic material having the Bi component added thereto. Since the Bi component is contained in the ceramic composition, the sinterability of the ceramic composition can be improved. The ceramic composition according to an embodiment may contain 0.05 to 4.5 parts by mass of the Bi component in terms of an oxide thereof ($Bi_2O_3$) relative to 100 parts by mass of the diopside crystal powder.

The ceramic composition according to an embodiment may further contain a Na component, a K component, a Ca component, a Mg component, a Ba component, a P component, and so on. The ceramic composition containing the Na component, the K component, the Ca component, the Mg component, the Ba component, and/or the P component is obtained by, for example, firing a ceramic material having the Na component, the K component, the Ca component, the Mg component, the Ba component, and/or the P component added thereto.

When the Na component or the K component is contained in the ceramic composition, the water resistance and the acid resistance can be improved without significantly impairing sinterability in the ceramic composition (sintered compact). The Na component and the K component may be contained in a total amount of 0 to 2 parts by mass in terms of oxides thereof ($Na_2O$, $K_2O$) relative to 100 parts by mass of the diopside crystal powder.

When the Ca component, the Mg component, and the Ba component are added to the ceramic material, a liquid phase is formed during sintering, and thus a sintering temperature can be lowered. The Ca component, the Mg component, and the Ba component may be contained in a total amount of 0 to 5 parts by mass in terms of oxides thereof (CaO, MgO, BaO) relative to 100 parts by mass of the diopside crystal powder.

Furthermore, when the P component is added to the ceramic material, a liquid phase is formed during sintering, and thus a sintering temperature can be lowered. The P component may be contained in an amount of 0 to 2 parts by mass in terms of an oxide thereof ($P_2O_5$) relative to 100 parts by mass of the diopside crystal powder.

Next, a description is given of an embodiment in which the main phase of the ceramic composition is a tungsten bronze pseudo-solid solution. As described above, the ceramic composition according to an embodiment of the present invention may contain a tungsten bronze pseudo-solid solution expressed by Formula (3) below as a main component.

$$Ba_4(Re_{(1-x)},Bi_x)_{9.33}Ti_{18}O_{54} \quad \text{Formula (3)}$$

The tungsten bronze pseudo-solid solution is prepared by making a mixture of Ba, Ti, Bi, and Re (rare earth element), calcining the mixture at 700 to 1200° C., and then firing it. The mixture is made by mixing the powder of materials such as the oxides and the carbonates of Ba, Ti, Bi, and Re (rare earth element) at the molar ratio as expressed in Formula (3).

In Formula (3), Re represents a rare earth element. In an embodiment, Re represents one or more rare earth elements selected from Sm, Nd, Pr, and La.

In Formula (3), x is 0 to 0.15, or more preferably 0.10 to 0.14. When x is 0 to 0.15, the temperature coefficient τf is zero or closer to zero than when x is outside this range. In particular, when x is 0.10 to 0.14, the temperature coefficient τf is zero or a value the same as or closer to zero than when x is 0 to 0.15. As x is larger, the permittivity ε is larger and the Q f value is smaller, while as x is smaller, the permittivity ε is smaller and the Q f value is larger. For this reason, x should be larger within the above range for a larger permittivity ε, and x should be smaller within the above range for a larger Q f value.

Next, a description is given of a method for manufacturing the ceramic composition according to an embodiment. The ceramic composition according to an embodiment is obtained in the following manner. A ceramic material is made of predetermined amounts of the diopside crystal powder, the Li component, the B component, and any component as required (for example, the Al component, the Zn component, the Cu component, the Ag component, the Co component, the Zr component, the Bi component, the Na component, the K component, the Ca component, the Mg component, the Ba component, and the P component). This ceramic material is mixed under wet (aqueous) conditions using $ZrO_2$ balls or the like. A binder, a plasticizer, a solvent and so on are added as required. The ceramic material is then molded and fired.

For example, the binder may be a polyvinyl butyral resin or a methacrylate resin, the plasticizer may be dibutyl phthalate or dioctyl phthalate, and the solvent may be toluene or methyl ethyl ketone.

Molding is accomplished by any of various known molding methods such as pressing, the doctor blade method, injection molding, or tape molding. The ceramic material may be molded into any shape.

Firing is performed, for example, for 0.5 to 3 hours at a temperature of 850 to 1000° C. in the atmosphere, an oxygen atmosphere, or a non-oxidizing atmosphere such as a nitrogen atmosphere.

In the ceramic composition (sintered compact) according to an embodiment obtained in this manner, a $SrTiO_3$ crystal may be present alone at any location selected from an inside, a boundary, and a triple junction of diopside crystal grains. A $SrTiO_3$ crystal can be identified by electron microscope observation.

In the sintered ceramic composition according to an embodiment, the permittivity ε and the Q f value are high, the temperature coefficient τf of resonance frequency is approximate to zero, the plating resistance is high, less erosion of a base member is caused by a plating process, and the water resistance, chemical resistance, and mechanical strength are high.

In the sintered ceramic composition according to an embodiment, the permittivity ε is from 7 to 15. In the sintered ceramic composition according to an embodiment, the Q f value is 10,000 or more. In the sintered ceramic composition according to an embodiment, the absolute value of the temperature coefficient τf of the resonance frequency is $30 \times 10^{-6}/°$ C. or less.

The sintered ceramic composition according to an embodiment, in which the absolute value of the temperature coefficient τf of the resonance frequency may be $30 \times 10^{-6}/°$ C. or less, and the Q f value may be 10,000 or more, can be suitably used for, for example, an electronic component for a high-frequency component such as a circuit board, a filter, or an antenna.

Figure 2:
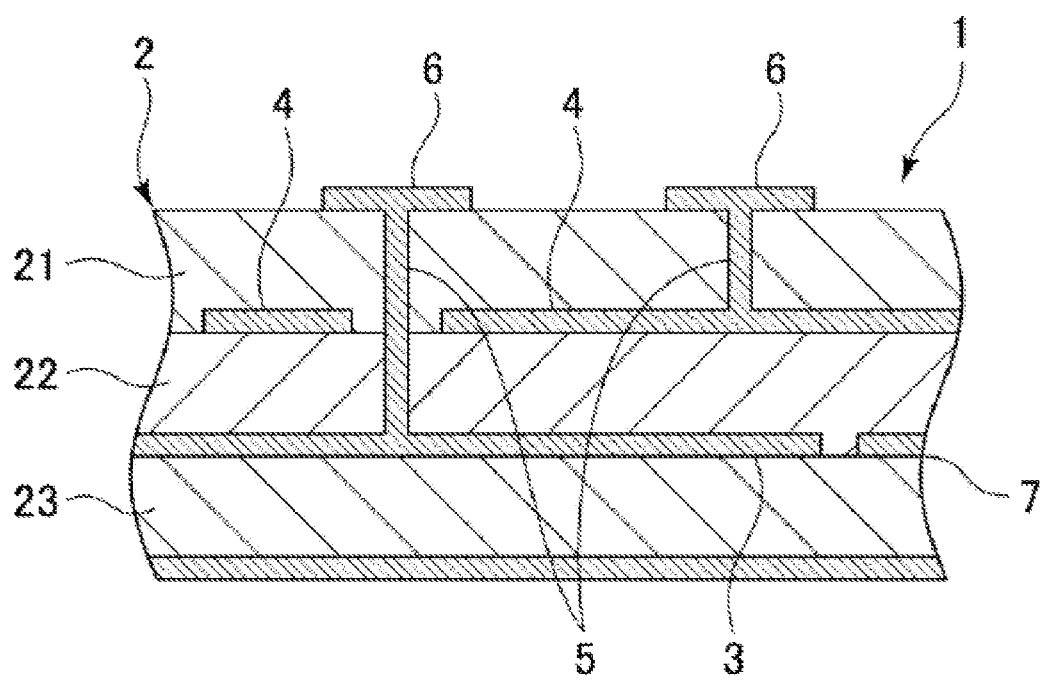
FIG. 2 is a sectional view schematically showing a longitudinal section of a multilayer filter including the ceramic composition according to an embodiment of the present invention.

Next, an electronic component according to an embodiment will be described with reference to FIG. 1. FIG. 2 is a sectional view schematically showing a longitudinal section of a multilayer filter 1 including the ceramic composition according to an embodiment of the present invention.

As shown, the multilayer filter 1 includes a ceramic base 2 formed at least partly of the above-described ceramic composition, a stripline 3, a ground plane 4, a via conductor 5, an external electrode 6, and an internal conductor pattern 7. The ceramic base 2 includes ceramic layers 21 to 23. The ground plane 4 is provided between the ceramic layer 21 and the ceramic layer 22. The stripline 3 and the internal conductor pattern 7 are provided between the ceramic layer 22 and the ceramic layer 23.

One example of a method for manufacturing the multilayer filter 1 will now be described. A binder, a solvent, a plasticizer, and so on are added to the above-described ceramic material to prepare a slurry. The slurry is then molded into a thin film by a method such as the doctor blade method, so as to manufacture a green sheet. Next, a through-hole is formed in the green sheet with a punching machine or a mold press.

Next, a conductor paste containing a conductor metal such as Ag, an Ag alloy, Cu, a Cu alloy, or the like is printed by screen printing or the like on the green sheet having the through hole formed therein, so as to form an unfired internal conductor layer having a predetermined pattern. Furthermore, the conductor paste is filled into the through hole to form an unfired via conductor. When fired, the internal conductor layer will form the stripline 3, the ground plane 4, or the internal conductor pattern 7, and the unfired via conductor filled in the through hole will form the via conductor 5. The conductor paste is preferably formed of a low-resistance material, in particular, Ag, an Ag alloy, Cu, or a Cu alloy. Examples of the Ag alloy include an Ag—Pd alloy and an Ag—Pt alloy. Examples of the Cu alloy include a Cu—Ca alloy, a Cu—Mg—Ca alloy, and a Cu—Ni—Fe alloy.

Next, a plurality of green sheets each including the unfired internal conductor layer and the unfired via conductor formed therein are stacked and pressure-bonded together to form an unfired laminate.

Next, the unfired laminate is subjected to a binder removal process and then cut into shape so that the unfired internal conductor layers are exposed at an end portion of the unfired laminate. Further, a conductor paste containing a conductor metal is printed on an end surface of the unfired laminate by screen printing or the like to form an unfired underlying metal.

Next, the unfired laminate with the unfired underlying metal formed thereon is fired at 870° C. to 930° C. for 0.5 to 3 hours in an oxygen atmosphere or a non-oxidizing atmosphere, so that the unfired laminate and the unfired underlying metal are co-fired.

Further, an underlying metal, which is formed by firing the unfired underlying metal, is subjected to a wet plating process such as electrolytic plating to form a plating layer on the surface of the underlying metal, thus forming the external electrode 6. In this way, the multilayer filter 1 is formed in which the stripline 3, the ground plane 4, and the internal conductor pattern 7 are formed between the layers of the ceramic base 2, and the external electrode 6 is formed on the surface of the ceramic base 2. As described above, the ceramic base 2 is formed of the ceramic composition according to the embodiment of the present invention.

In the ceramic base 2 of the multilayer filter 1 according to one embodiment, the permittivity ε is 7 to 15, the Q f value is 10,000 or more, and an absolute value of the temperature coefficient τf of the resonance frequency at a temperature in a range of −25° C. to 85° C. is $30 \times 10^{-6}$/° C. or less, and thus the multilayer filter 1 has excellent dielectric characteristics in a high-frequency region. Furthermore, the ceramic base 2 can be sintered at such a temperature that it can be co-fired with a low-resistance metal such as Ag, an Ag alloy, Cu, or a Cu alloy, and thus any of these low-resistance metals can be used as the conductor metal.

The multilayer filter 1 is an example of an electronic component according to one embodiment. The electronic component according to one embodiment may also be a single-layer substrate, a multilayer substrate, a capacitor, and any other electronic component, in addition to a filter.

Herein, the contents of the components contained in the ceramic composition refer to the respective contents in the sintered ceramic composition (namely, the respective contents in the sintered compact of the ceramic composition), unless otherwise mentioned. The components contained in the ceramic composition are the Li component and the B component, and optionally the Al component, the Zn component, the Cu component, the Ag component, the Co component, the Zr component, the Bi component, the Na component, the K component, the Ca component, the Mg component, the Ba component, and the P component. The contents of these components in the sintered ceramic composition are measured by, for example, ICP (inductively coupled plasma) mass analysis, titrimetric analysis, or any other known method.

EXAMPLES

Predetermined amounts of $SiO_2$ powder, CaO powder, and MgO powder were wet-mixed for 15 hours and then dried at 120° C., and the dried powder was calcined at 1200° C. for two hours in the atmosphere. The calcined object was pulverized into diopside crystal powder having an average grain size of 1.1 μm. The amounts of $SiO_2$, CaO, and MgO contained in the diopside crystal powder were measured by ICP at 55 mass % $SiO_2$, 18.8 mass % MgO, and 26.2 mass % CaO. Powders of $Li_2O$, $B_2O_3$, CuO, and ZnO were prepared in the respective amounts shown in the Composition columns of Tables 1 and 2. These powders were added to the diopside crystal powder, and this mixture was wet-mixed for 15 hours and then dried at 150° C. The dried mixture was mixed with an adequate amount of PVA-based binder and subjected to granulation and press-molding to obtain a sheet-shaped unheated mold having a thickness of 10 μm. This premold obtained by press-molding was heated at 500° C. in the atmosphere for the binder removal process to obtain a sheet mold. An Ag paste was printed on each of upper and lower surfaces of the sheet mold, and the sheet mold and the Ag paste were co-fired at 900° C. for 2 hours in the atmosphere, so as to obtain ceramic compositions (sintered compacts) of Sample Nos. 1 to 33. The ceramic compositions are sheet-shaped and include, on each of the upper and lower surfaces thereof, a conductive layer formed of the fired Ag paste. The contents of diopside ($CaMgSi_2O_6$), $Li_2O$, and $B_2O_3$ contained in each of the samples were measured by the ICP mass analysis. Tables 1 and 2 show results of the measurement.

TABLE 1

| Sample No. | Composition [wt %] | | | | Evaluation | | |
|---|---|---|---|---|---|---|---|
| | $CaMgSi_2O_6$ | $Li_2O$ | $B_2O_3$ | $Li_2O$ + $B_2O_3$ | Sinterability | Q Value | High-temperature Reliability |
| No. 1 | 100 | 0.30 | 0.05 | 0.35 | B | — | — |
| No. 2 | 100 | 0.25 | 0.10 | 0.35 | B | — | — |
| No. 3 | 100 | 0.30 | 0.10 | 0.40 | B | — | — |
| No. 4 | 100 | 0.30 | 0.15 | 0.45 | A | 2100 | A |
| No. 5 | 100 | 0.40 | 0.20 | 0.60 | A | 1900 | A |

TABLE 1-continued

| Sample No. | Composition [wt %] CaMgSi$_2$O$_6$ | Li$_2$O | B$_2$O$_3$ | Li$_2$O + B$_2$O$_3$ | Evaluation Sinterability | Q Value | High-temperature Reliability |
|---|---|---|---|---|---|---|---|
| No. 6 | 100 | 0.60 | 0.30 | 0.90 | A | 1700 | A |
| No. 7 | 100 | 0.80 | 0.40 | 1.20 | A | 1500 | A |
| No. 8 | 100 | 1.00 | 0.50 | 1.50 | A | 1250 | A |
| No. 9 | 100 | 1.20 | 0.60 | 1.80 | A | 1100 | A |
| No. 10 | 100 | 1.40 | 0.70 | 2.10 | A | 1000 | A |
| No. 11 | 100 | 1.40 | 0.85 | 2.25 | A | 800 | A |
| No. 12 | 100 | 1.40 | 1.00 | 2.40 | A | 740 | B |
| No. 13 | 100 | 0.5 | 0.7 | 1.2 | B | — | — |
| No. 14 | 100 | 0.6 | 0.6 | 1.2 | A | 1450 | A |
| No. 15 | 100 | 0.7 | 0.5 | 1.2 | A | 1480 | A |
| No. 16 | 100 | 0.9 | 0.3 | 1.2 | A | 1520 | A |
| No. 18 | 100 | 1 | 0.2 | 1.2 | A | 1550 | A |
| No. 19 | 100 | 1.1 | 0.10 | 1.2 | A | 1560 | A |
| No. 20 | 100 | 1.15 | 0.05 | 1.2 | B | — | — |
| No. 21 | 100 | 1.125 | 1.13 | 2.25 | A | 750 | B |
| No. 22 | 100 | 1.25 | 1.00 | 2.25 | A | 780 | A |
| No. 23 | 100 | 1.50 | 0.75 | 2.25 | A | 820 | A |
| No. 24 | 100 | 1.60 | 0.65 | 2.25 | A | 880 | B |
| No. 25 | 100 | 0.25 | 0.2 | 0.45 | B | — | — |
| No. 26 | 100 | 0.35 | 0.1 | 0.45 | A | 2200 | A |
| No. 27 | 100 | 0.4 | 0.05 | 0.45 | B | — | — |
| No. 28 | 100 | 0.3 | 1.13 | 1.425 | A | 760 | B |
| No. 29 | 100 | 0.9 | 1.13 | 2.025 | A | 750 | B |
| No. 30 | 100 | 1.5 | 1.13 | 2.625 | A | 720 | B |
| No. 31 | 100 | 1.60 | 0.15 | 1.75 | A | 910 | B |
| No. 32 | 100 | 1.60 | 0.45 | 2.05 | A | 900 | B |
| No. 33 | 100 | 1.60 | 0.75 | 2.35 | A | 860 | B |

TABLE 2

| Sample No. | Composition [wt %] CaMgSi$_2$O$_6$ | Li$_2$O | B$_2$O$_3$ | CuO | ZnO | Li$_2$O/ B$_2$O$_3$ | Evaluation Area Percentage of Main Crystal Regions | Q Value | Rate of Change in flexural strength |
|---|---|---|---|---|---|---|---|---|---|
| No. 34 | 100 | 0.5 | 0.9 | — | — | 0.56 | 0 | 1000 | 0% |
| No. 35 | 100 | 0.6 | 0.8 | — | — | 0.75 | 20% | 1020 | −1% |
| No. 36 | 100 | 0.7 | 0.7 | — | — | 1.00 | 30% | 1400 | 0% |
| No. 37 | 100 | 1.1 | 0.3 | — | — | 3.67 | 50% | 1700 | −2% |
| No. 38 | 100 | 1.2 | 0.2 | — | — | 6.00 | 85% | 1750 | −4% |
| No. 39 | 100 | 1.25 | 0.15 | — | — | 8.33 | 90% | 1750 | −8% |
| No. 40 | 100 | 1.3 | 0.1 | — | — | 13.00 | 95% | 1750 | −26% |
| No. 41 | 100 | 0.3 | 2.7 | 1.0 | 4.0 | 0.11 | 0% | 980 | 0% |
| No. 42 | 100 | 0.4 | 2.6 | 1.0 | 4.0 | 0.15 | 20% | 1000 | 0% |
| No. 43 | 100 | 0.5 | 2.5 | 1.0 | 4.0 | 0.20 | 30% | 1510 | −1% |
| No. 44 | 100 | 1.2 | 1.8 | 1.0 | 4.0 | 0.67 | 50% | 1640 | −1% |
| No. 45 | 100 | 2.5 | 0.5 | 1.0 | 4.0 | 5.00 | 80% | 1670 | −5% |
| No. 46 | 100 | 2.6 | 0.4 | 1.0 | 4.0 | 6.50 | 90% | 1690 | −8% |
| No. 47 | 100 | 2.7 | 0.3 | 1.0 | 4.0 | 9.00 | 93% | 1710 | −21% |

Each of the samples in Table 1 was evaluated for sinterability, Q value, and high-temperature reliability, and results of the evaluation are shown in Table 1. Sinterability of each sample was evaluated based on a relative density measured by the Archimedes' method. Samples having a relative density of 98% or more were evaluated as sinterable, and samples having a relative density of less than 98% were evaluated as non-sinterable. In Table 1, samples evaluated as sinterable are indicated by "A" in the Sinterability column, while samples evaluated as non-sinterable are indicated by "B" in the Sinterability column.

Each sample evaluated as sinterable was measured for a permittivity and a dielectric loss tangent tan δ at a resonance frequency of 10 GHz to 15 GHz in conformity to JIS R1627. The reciprocal value (1/tan δ) of the dielectric loss tangent tan δ is shown as the quality factor (Q) in Table 2. The quality factor Q was calculated for 10 GHz.

The high-temperature reliability test for evaluating high-temperature reliability was carried out at a temperature of 150° C. by applying a voltage having an electric field strength of 1 V/μm between the conductive layers provided respectively on the upper and lower surfaces of the samples. The point of time when a short circuit occurred (the point of time when insulation resistance fell below $10^{-5}\Omega$) was regarded as the occurrence of a failure. Samples with the time to failure of more than 1000 hours were evaluated as acceptable, and samples with a time to failure of 1000 hours or less were evaluated as defective. The high-temperature reliability test was carried out on each sample evaluated as sinterable. In Table 1, samples evaluated as acceptable in the high-temperature reliability test are indicated by "A" in the High-temperature Reliability column, while samples evaluated as defective are indicated by "B" in the High-temperature Reliability column.

Based on the results of the evaluation on sinterability of Samples No. 1 to 12, it has been found that sintering occurs at 900° C. when the total content of Li$_2$O and B$_2$O$_3$ is larger than 0.40 parts by mass relative to 100 parts by mass of the diopside crystal (the principal component), and sintering does not occur at 900° C. when the total content of Li$_2$O and B$_2$O$_3$ is 0.40 parts by mass or less relative to the same.

Based on the results of the high-temperature reliability test on Samples No. 11 and 12, it has been found that poor high-temperature reliability results when the total content of Li$_2$O and B$_2$O$_3$ is larger than 2.25 parts by mass relative to 100 parts by mass of the diopside crystal. This should be because a larger volume of glassy phase is formed when a Li—B-based liquid phase segregated on the periphery or the grain boundary of diopside crystal grains is cooled.

Based on the results of the evaluation on sinterability of Samples No. 13 to 20 (Sample No. 17 is lacking), it has been confirmed that sintering does not occur at 900° C. when more B$_2$O$_3$ is contained than Li$_2$O. This should be because as the proportion of Li in a Li—B-based liquid phase produced during sintering is lower, the solubility of diopside ($CaMgSi_2O_6$) in the liquid phase is lower. Furthermore, based on the results of the evaluation on sinterability of Samples No. 19 and 20, it has been confirmed that sintering does not occur at 900° C. when the content of $B_2O_3$ is less than 0.1 parts by mass relative to 100 parts by mass of the diopside crystal. This should be because no Li—B-based liquid phase was produced when the content of $B_2O_3$ is less than 0.1 parts by mass.

Based on the results of the high-temperature reliability test on Samples No. 21 to 24, it has been found that poor high-temperature reliability results when the content of $B_2O_3$ is larger than 1 part by mass relative to 100 parts by mass of the diopside crystal. This should be because a larger volume of glassy phase is formed when a B-rich Li—B-based liquid phase segregated on the periphery or the grain boundary of diopside crystal grains is cooled. Furthermore, based on the results of the high-temperature reliability test on Samples No. 21 to 24, it has been found that poor high-temperature reliability results when the content of $Li_2O$ is larger than 1.5 parts by mass relative to 100 parts by mass of the diopside crystal. This should be because a larger volume of glassy phase is formed when a Li-rich Li—B-based liquid phase segregated on the periphery or the grain boundary of diopside crystal grains is cooled.

Based on the results of the evaluation on sinterability of Sample No. 25 and Sample No. 4 described above, it has been confirmed that sintering does not occur at 900° C. when the content of $Li_2O$ is less than 0.3 parts by mass relative to 100 parts by mass of the diopside crystal. This should be because the solubility of diopside ($CaMgSi_2O_6$) in the liquid phase is lower when the content of $Li_2O$ is less than 0.3 parts by mass. Furthermore, based on the results of the evaluation on sinterability of Samples No. 26 and 27, it has been confirmed again that sintering does not occur at 900° C. when the content of $B_2O_3$ is less than 0.1 parts by mass relative to 100 parts by mass of the diopside crystal.

Based on the results of the high-temperature reliability test on Samples No. 28 to 30, it has been found that poor high-temperature reliability results, regardless of the content of $Li_2O$, when the content of $B_2O_3$ is larger than 1 part by mass relative to 100 parts by mass of the diopside crystal.

Based on the results of the high-temperature reliability test on Samples No. 31 to 33, it has been found that poor high-temperature reliability results, regardless of the content of $B_2O_3$, when the content of $Li_2O$ is larger than 1.5 parts by mass relative to 100 parts by mass of the diopside crystal.

Each of the samples in Table 2 was evaluated for area percentage of the main crystal regions, Q value, and flexural strength. The results of the evaluation are shown in Table 2. The area percentage of the main crystal regions is the proportion of the main crystal regions, which contain no or little sintering agent component, among all the unit observation regions in an observation field. The observation field was a part of an exposed sectional surface of each sample and had an area of 50 µm×40 µm. The observation field was divided laterally into ten equal parts and longitudinally into eight equal parts to define unit observation regions each having an area of 5 µm square. The observation field was observed under the electron probe micro-analyzer (EPMA) to obtain a distribution image of B element. Based on the distribution image, the area occupied by B element was determined for each unit observation region in the observation field. When this area was 0% to 0.5% of the area of the unit observation region, this unit observation region was determined to be a main crystal region. Each unit observation region in the observation field was examined to determine whether it was a main crystal region, and the area percentage of the main crystal regions was found at the proportion of the unit observation regions that are determined to be the main crystal regions among all the unit observation regions in the observation field. The area percentages thus obtained and rounded off are shown in Tables 2 and 3.

For each of samples No. 34 to 47, a transverse test piece was cut out from the sintered compact of the ceramic composition, and the transverse test piece was subjected to the transverse test in conformity to JIS R1601 to measure the flexural strength of the sample. For each of samples No. 34 to 40, the rate of change in the flexural strength was determined relative to the flexural strength of sample No. 34. The determined rate of change in the flexural strength is shown in Table 2. Samples with a negative change in flexural strength have a lower flexural strength than the reference specimen No. 34.

Based on the measurement results of the Q value of Samples No. 34 to 47, it has been found that the Q value is significantly larger when the area percentage of the main crystal regions is 30% or more. This should be because when the viscosity of the sintering agent is reduced during sintering of the ceramic material, the main crystal grows large so as to increase the Q value, and the unevenness of the sintering agent deposited on the periphery or the grain boundary of the main crystal is increased.

Based on the rate of change in the flexural strength of Samples No. 34 to 47, it has been found that the flexural strength is significantly degraded when the area percentage of the main crystal regions is more than 90%. This should be because the increased unevenness of the deposited sintering agent having a lower strength encourages breakage of the ceramic composition in the regions where the sintering agent is segregated.

Powders of $BaCO_3$, $TiO_2$, $Bi_2O_3$, and $Nd_2O_3$ were prepared in respective amounts according to the molar ratio of Ba, Ti, Bi, and Nd as expressed in the following formula. These powders were wet-mixed for 15 hours and then dried at 120° C. The dried powder was calcined at 1100° C. for two hours to prepare the main phase component.

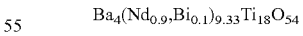

$$Ba_4(Nd_{0.9}Bi_{0.1})_{9.33}Ti_{18}O_{54}$$

Next, powders of $Li_2O$ and $B_2O_3$ were prepared in the respective amounts shown in the Composition columns of Table 3. These powders were added to the main phase component, and this mixture was wet-mixed for 15 hours and then dried at 120° C. The dried product was mixed with an adequate amount of PVA-based binder, subjected to granulation and press-molding, and then heated to 500° C. in the atmosphere for the binder removal process to obtain a mold. The mold was fired for two hours at 930° C. in the atmosphere to obtain sintered compacts of Samples No. 48 to 54.

TABLE 3

| Sample No. | Composition [wt %] | | | | Evaluation | | |
|---|---|---|---|---|---|---|---|
| | $Ba_4(Nd_{0.9}, Bi_{0.1})_{9.33}Ti_{18}O_{54}$ | $Li_2O$ | $B_2O_3$ | $Li_2O/ B_2O_3$ | Area Percentage of Main Crystal Regions | Q Value | Rate of Change in flexural strength |
| No. 48 | 100 | 0.1 | 1.35 | 0.07 | 0% | 290 | 0% |
| No. 49 | 100 | 0.3 | 1.15 | 0.26 | 20% | 310 | −1% |
| No. 50 | 100 | 0.5 | 0.95 | 0.53 | 30% | 550 | −2% |
| No. 51 | 100 | 0.75 | 0.7 | 1.07 | 60% | 570 | −4% |
| No. 52 | 100 | 1.0 | 0.45 | 2.22 | 85% | 570 | −5% |
| No. 53 | 100 | 1.15 | 0.3 | 3.83 | 90% | 580 | −9% |
| No. 54 | 100 | 1.25 | 0.2 | 6.25 | 96% | 580 | −30% |

Each of the samples in Table 3 was evaluated for area percentage of the main crystal regions, Q value, and flexural strength in the same manner as the samples in Table 2. The results of the evaluation are shown in Table 3. The results of the evaluation shown in Table 3 indicate that the Q value is significantly larger when the area percentage of the main crystal regions is 30% or more, and the flexural strength is significantly degraded when the area percentage of the main crystal regions is more than 90%. This is true for the case where the main phase is a tungsten bronze pseudo-solid solution as in Table 3, as well as the case where the main phase is diopside.

What is claimed is:

1. A ceramic composition comprising:
a main phase component represented by $CaMgSi_2O_6$ or $Ba_4(Re_{(1-x)}, Bi_x)_{9.33}Ti_{18}O_{54}$; and
an additive component containing a Li component and a B component,
wherein an area percentage of main crystal regions relative to an observation field is 30% or more, the observation field being divided into a plurality of unit observation regions, the main crystal regions being the unit observation regions containing 0.5% or less by area of the additive component, and
wherein the ceramic composition contains 0.1 to 1 part by mass of the B component in terms of an oxide thereof, relative to 100 parts by mass of the main phase component.

2. The ceramic composition of claim 1, wherein the area percentage of the main crystal regions is 90% or less.

3. The ceramic composition of claim 1, wherein a content of the Li component in terms of an oxide thereof is larger than a content of the B component in terms of an oxide thereof.

4. The ceramic composition of claim 1,
wherein the main phase component is represented by $CaMgSi_2O_6$,
wherein the ceramic composition contains 0.3 to 1.5 parts by mass of the Li component in terms of an oxide thereof, relative to 100 parts by mass of the main phase component,
wherein a content of the Li component in terms of the oxide thereof is larger than a content of the B component in terms of the oxide thereof, and
wherein a total content of the Li component and the B component is 2.25 parts by mass or less in terms of the oxides thereof.

5. The ceramic composition of claim 4, further comprising 3.6 to 19 parts by mass of $SrTiO_3$ powder relative to 100 parts by mass of the main phase component.

6. The ceramic composition of claim 4, further comprising 0 to 3 parts by mass of an Ag component in terms of an oxide thereof relative to 100 parts by mass of the main phase component.

7. The ceramic composition of claim 4, further comprising 0 to 1 part by mass of a Si component in terms of an oxide thereof relative to 100 parts by mass of the main phase component.

* * * * *